US008822295B2

(12) United States Patent
Chang et al.

(10) Patent No.: US 8,822,295 B2
(45) Date of Patent: Sep. 2, 2014

(54) LOW EXTENSION DOSE IMPLANTS IN SRAM FABRICATION

(75) Inventors: Leland Chang, New York, NY (US); Chung-Hsun Lin, White Plains, NY (US); Shih-Hsien Lo, Mount Kisco, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/438,437

(22) Filed: Apr. 3, 2012

(65) Prior Publication Data
US 2013/0260525 A1  Oct. 3, 2013

(51) Int. Cl.
H01L 29/78 (2006.01)

(52) U.S. Cl.
USPC .......................................... 438/294; 257/336

(58) Field of Classification Search
USPC .......................................... 438/163; 257/336
See application file for complete search history.

(56) References Cited

U.S. PATENT DOCUMENTS

| 5,262,655 | A  | * | 11/1993 | Ashida ............................. 257/66 |
| 5,264,380 | A  | * | 11/1993 | Pfiester ........................... 438/288 |
| 5,494,843 | A  | * | 2/1996  | Huang ............................ 438/210 |
| 5,872,030 | A  | * | 2/1999  | Huang ............................ 438/210 |
| 6,198,173 | B1 | * | 3/2001  | Huang ............................ 257/536 |
| 6,268,750 | B1 |   | 7/2001  | Esch, Jr. |
| 6,281,084 | B1 | * | 8/2001  | Akatsu et al. .................. 438/301 |
| 6,281,088 | B1 | * | 8/2001  | Kim ............................... 438/306 |
| 6,309,975 | B1 |   | 10/2001 | Wu et al. |
| 6,806,534 | B2 |   | 10/2004 | Dokumaci et al. |
| 6,808,965 | B1 | * | 10/2004 | Miyasaka et al. ............. 438/151 |
| 6,894,356 | B2 |   | 5/2005  | Choi |
| 6,934,182 | B2 | * | 8/2005  | Chan et al. .................... 365/154 |
| 7,183,662 | B2 | * | 2/2007  | Kim et al. ...................... 257/314 |
| 7,274,072 | B2 |   | 9/2007  | Chang et al. |
| 7,391,080 | B2 |   | 6/2008  | Arnborg et al. |
| 7,494,886 | B2 | * | 2/2009  | Ren et al. ....................... 438/303 |
| 7,550,337 | B2 | * | 6/2009  | Chang et al. .................. 438/199 |
| 7,718,496 | B2 |   | 5/2010  | Frank et al. |
| 7,787,284 | B2 |   | 8/2010  | Chan et al. |
| 7,911,008 | B2 |   | 3/2011  | Chen et al. |
| 8,018,007 | B2 |   | 9/2011  | Chang et al. |

(Continued)

FOREIGN PATENT DOCUMENTS

WO  2010023608 A2  3/2010

OTHER PUBLICATIONS

Kang et al., "Effects of gate edge profile on off-state leakage suppression in metal gate/high-k dielectric n-type metal-oxide-semiconductor field effect transistors," Applied Physics Letters 90, 183501 (2007).

(Continued)

*Primary Examiner* — Kevin Parendo
*Assistant Examiner* — Charles N Ausar-El
(74) *Attorney, Agent, or Firm* — Cantor Colburn LLP; Vazken Alexanian

(57) ABSTRACT

A static random access memory fabrication method includes forming a gate stack on a substrate, forming isolating spacers adjacent the gate stack, the isolating spacers and gate stack having a gate length, forming a source and drain region adjacent the gate stack, which generates an effective gate length, wherein the source and drain regions are formed from a low extension dose implant that varies a difference between the gate length and the effective gate length.

12 Claims, 4 Drawing Sheets

(56) References Cited

U.S. PATENT DOCUMENTS

| | | |
|---|---|---|
| 8,253,195 B2 | 8/2012 | Lotfi et al. |
| 8,253,197 B2 | 8/2012 | Lotfi et al. |
| 2003/0162341 A1 | 8/2003 | Raebiger et al. |
| 2005/0179067 A1 | 8/2005 | Song |
| 2006/0046372 A1* | 3/2006 | Momiyama et al. ......... 438/199 |
| 2006/0231899 A1 | 10/2006 | Chang et al. |
| 2006/0255375 A1 | 11/2006 | Dokumaci et al. |
| 2007/0048918 A1* | 3/2007 | Shibata et al. ............... 438/197 |
| 2007/0158743 A1 | 7/2007 | Chang et al. |
| 2008/0303105 A1 | 12/2008 | Chang et al. |
| 2008/0308874 A1 | 12/2008 | Letavic et al. |
| 2009/0108295 A1* | 4/2009 | Mowry et al. ................ 257/190 |
| 2009/0273041 A1 | 11/2009 | Chang et al. |
| 2009/0290439 A1 | 11/2009 | Chang et al. |
| 2010/0052051 A1 | 3/2010 | Lotfi et al. |
| 2010/0207213 A1 | 8/2010 | Tan et al. |
| 2011/0049621 A1 | 3/2011 | Lotfi et al. |
| 2011/0163379 A1 | 7/2011 | Sleight et al. |
| 2011/0230039 A1 | 9/2011 | Mowry et al. |
| 2011/0294270 A1* | 12/2011 | Nishisaka ..................... 438/197 |
| 2011/0317485 A1* | 12/2011 | Liaw ............................. 365/182 |
| 2012/0161245 A1 | 6/2012 | Higuchi |
| 2012/0182793 A1 | 7/2012 | Chang et al. |
| 2012/0190159 A1 | 7/2012 | Chang et al. |
| 2013/0126970 A1 | 5/2013 | Bulucea et al. |
| 2013/0299917 A1* | 11/2013 | Yang et al. .................... 257/401 |

OTHER PUBLICATIONS

Mann et al., "Ultralow-power SRAM technology," IBM J. Res. & Dev. vol. 47 No. 5/6 Sep./Nov. 2003.

Augendre et al. "Superior N- anf PMOSFET scalability using carbon co-implementation and spike annealing." In: Solid-State Electronics, vol. 51, issues 11-12, Nov.-Dec. 2007, pp. 1432-1436, [online] [retrieved on Apr. 10, 2013 (10.04.201.)] Retrieved from the Internet <URL: http://www.sciencedirect.com/science/article/pii/S003811010700319X>.

International Search Report and Written Opinion; International Application No. PCT/US13/26779; International Filing Date: Feb. 20, 2013; Date of Mailing: May 13, 2013; 18 pages.

\* cited by examiner

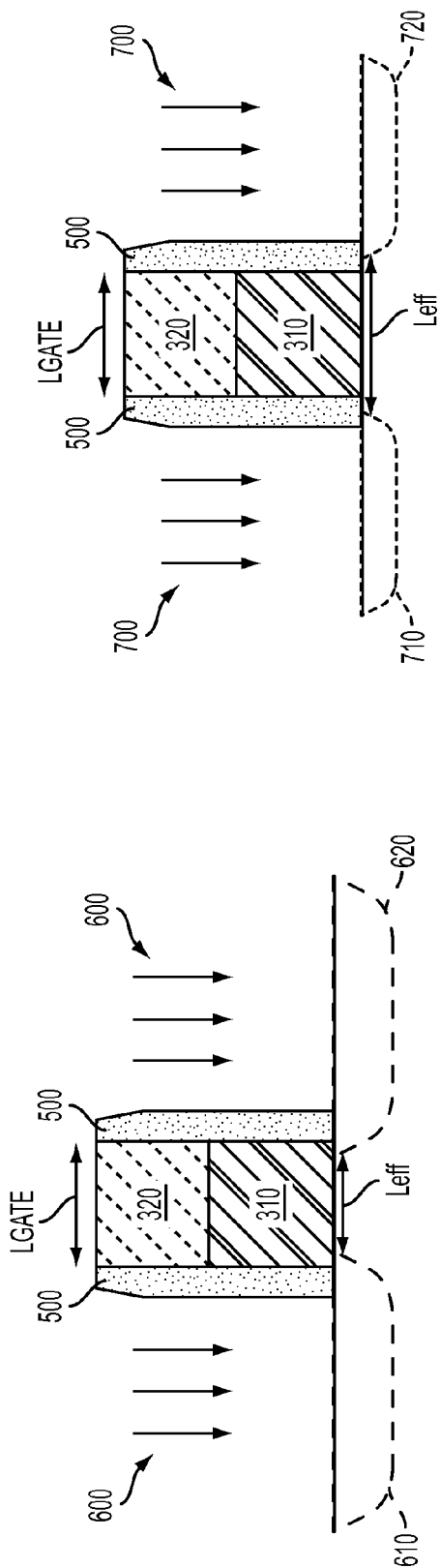
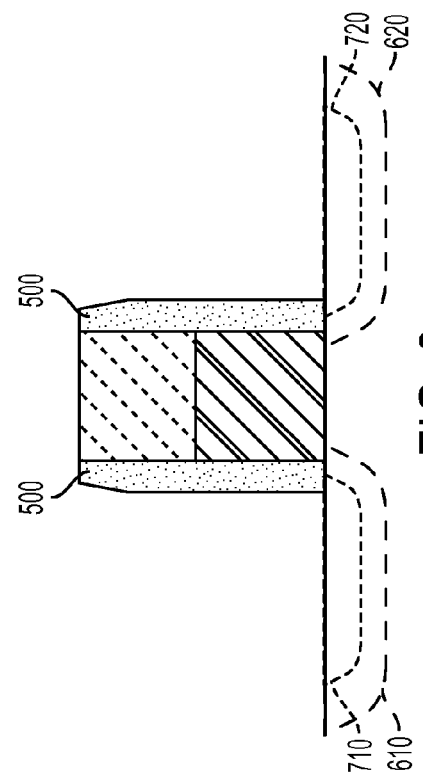

LOW EXTENSION DOSE IMPLANTS IN SRAM FABRICATION

BACKGROUND

The present invention relates to static random access memory (SRAM) fabrication, and more specifically, to a fabrication method that implements a low extension dose implant for source and drain formation.

SRAM cell design typically begins by selecting the smallest p-type field effect transistor (PFET) supported by a particular technology and then scaling the n-type field effect transistor (NFET) pass gate and pull down field effect transistors (FETs) accordingly for proper beta ratio, cell stability, and access time. With the recent introduction of increasing amounts of uniaxial strain to PFETs (both through overlayer films and embedded silicon germanium (SiGe) source/drains), PFET drive current is increasing faster than that for the NFET. This drive current differential degrades writeability margins in existing SRAM cell designs because the NFET pass-gates are now relatively weaker when fighting the PFET during a write event. One approach around this problem is to increase NFET widths, which is undesirable because it would greatly increase cell area. Decreasing NFET transition voltages (Vt's) could compensate writeability concerns, but would also increase leakage power. Another possibility would be to weaken the PFET by raising its Vt, but this will degrade cell stability and limit the operability of the array at lower drain-drain voltage (Vdd).

SUMMARY

Exemplary embodiments include a static random access memory fabrication method, including forming a gate stack on a substrate, forming isolating spacers adjacent the gate stack, the isolating spacers and gate stack having a gate length, forming a source and drain region adjacent the gate stack, which generates an effective gate length, wherein the source and drain regions are formed from a low extension dose implant that decreases a difference between the gate length and the effective gate length.

Additional exemplary embodiments include a static random access memory fabrication method, including performing a low extension dose implant adjacent a gate stack and isolating spacers on a substrate, wherein the low dose extension implant is performed at an energy between 1 keV and 10 keV and at a p-type dose between 1E10 atoms/cm$^3$ to 1E13 atoms/cm$^3$.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIG. 6 illustrates an example of a device if a conventional high extension dose is implemented to form source and drain regions;

FIG. 7 illustrates an example of a device implementing the exemplary low extension dose to form source and drain regions;

FIG. 8 illustrates a device with a comparison of the source and drain junctions of the high extension dose and the low extension dose.

DETAILED DESCRIPTION

The exemplary systems and methods described herein include fabrication methods and devices that have a decreased lightly doped drain (LDD) (extension dose) implant levels. It will be appreciated that the dose ranges described herein and illustrative and that the exemplary embodiments described herein are not limited to the illustrative dose ranges. For illustrative purposes, six transistor (6T) and eight transistor (8T) SRAM designs are illustrated and discussed. It will be appreciated that other designs are contemplated in other embodiments. In exemplary embodiments, with the decreased LDD implant dose, the connection to the pull down PFET is more resistive (i.e., higher external resistance, Rext). The increased resistance of the pull down PFET lowers the current drive without increasing the channel length or the Vt. As described herein, conventionally, the drive current differential degrades writeability margins in existing SRAM cell designs because the NFET pass-gates are now relatively weaker when fighting the PFET during a write event. Conventional approaches include increasing NFET widths, which is undesirable because it would greatly increase cell area. Another approach is decreasing NFET Vt's that compensates writeability concerns, but also increases leakage power. Another approach has been to weaken the PFET by raising its Vt, which degrades cell stability and limit the operability of the array at lower Vdd. In addition, current techniques implement a custom implant level to raise Vt. This current technique includes an additional mask step, but does not have the cell stability drawbacks as raising Vt. In exemplary embodiments, the PFET is underlapped, lowering the leakage in the transistor inverters, as well as the total standby power in the 6T or 8T array.

In exemplary embodiments, the systems and methods described herein implement standard fabrication techniques (e.g., complementary metal on silicon (CMOS) process flow) to fabricate the SRAM arrays described herein. In exemplary embodiments, a masking step and implanting step are implemented for the pull down PFETs in the SRAM array.

Figure 1:
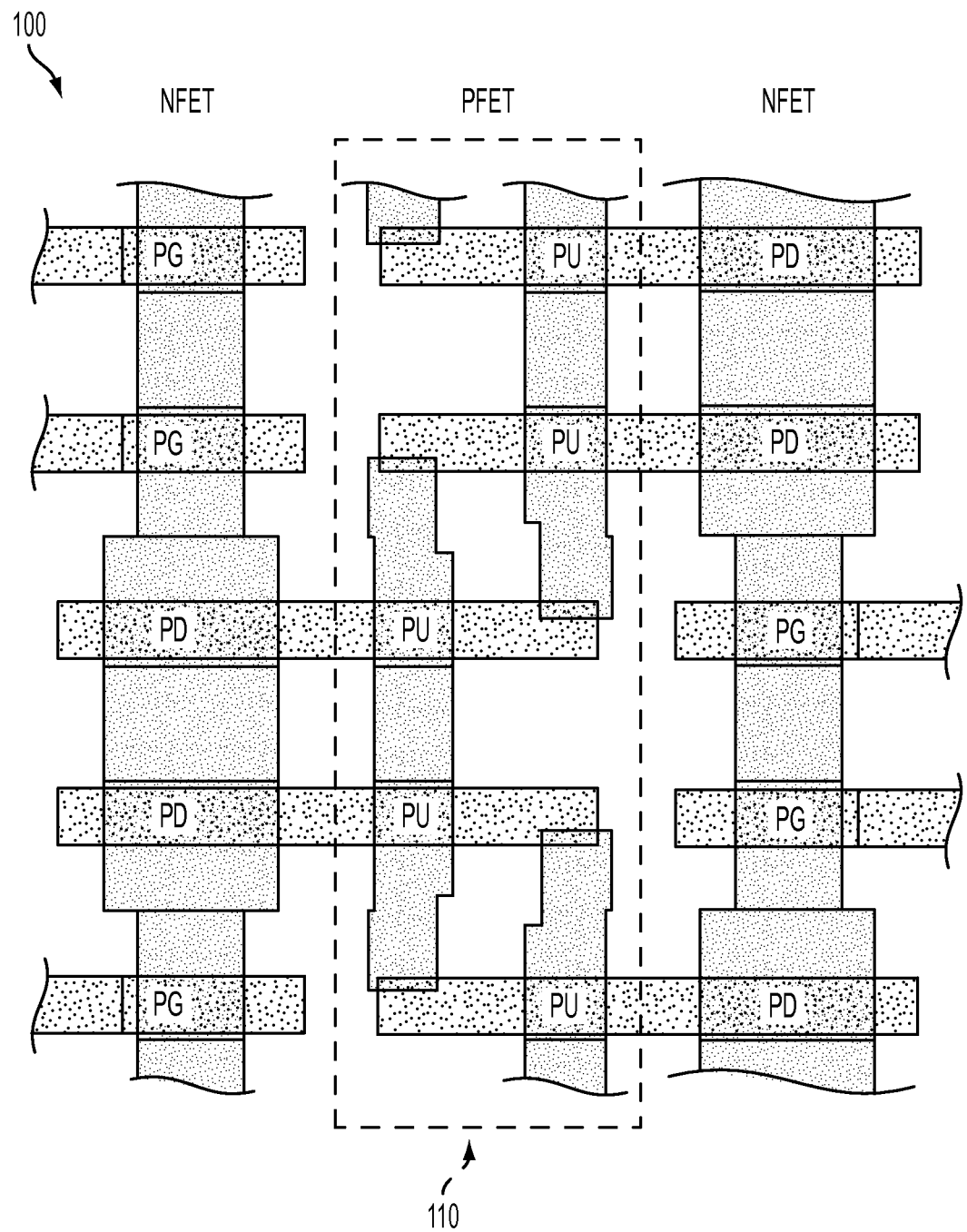
FIG. 1. illustrates a top plan view of an SRAM array in accordance with exemplary embodiments.

FIG. 1. illustrates a top plan view of an SRAM array 100 in accordance with exemplary embodiments. In this example, the array 100 is a 6T cell in which PFET active regions would receive different LDD implant doses as compared to the other regions. As illustrated the array 100 includes both NFET and PFET transistors, which include both pull up transistors PU, pull down transistors PD, and pass-gate transistors PG. As described herein, with the decreased LDD implant dose, the connection to the pull down PFET (i.e., PD) is more resistive (i.e., higher Rext). The increased resistance of the pull down PFET lowers the current drive without increasing the channel length or the Vt. As such, after forming a gate stack with conventional fabrication techniques, a fabrication step can be added to the fabrication flow to perform the exemplary low dose implant. As illustrated in FIG. 1, a region 110 is the area of the SRAM array in which the exemplary low dose implants and directed to the PU transistors in the array. Subsequent fabrications steps can then include other fabrication steps for additional implant for the source/drain regions as well as device such as the formation of a liner or other metal interconnects.

Figure 2:
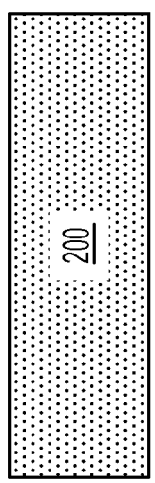
FIG. 2 illustrates a substrate onto which a gate stack can be formed.
Figure 4:
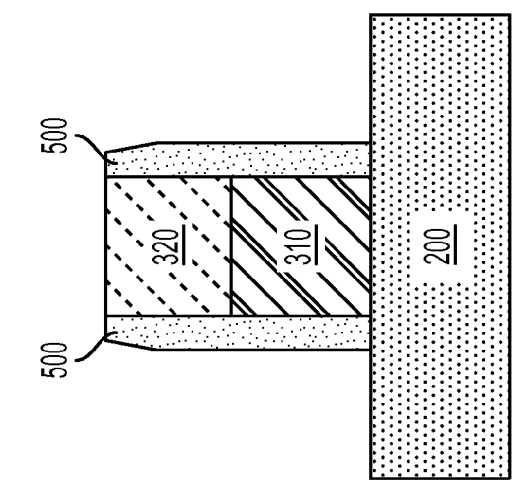
FIG. 4 illustrates a spacer material deposited on a substrate and gate stack.
Figure 5:
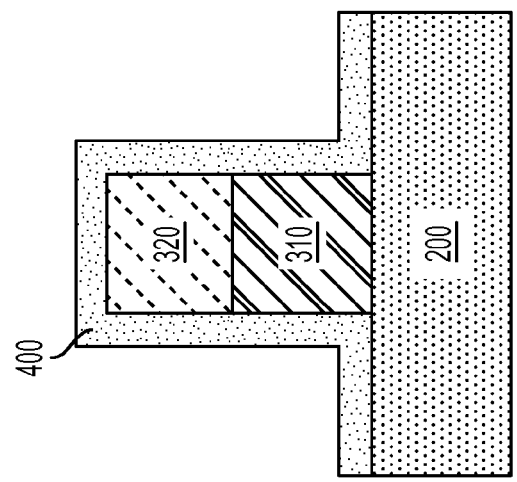
FIG. 5 illustrates a portion of a spacer material removed from a substrate and gate stack, forming suitable isolating spacers on the gate stack.
Figure 3:
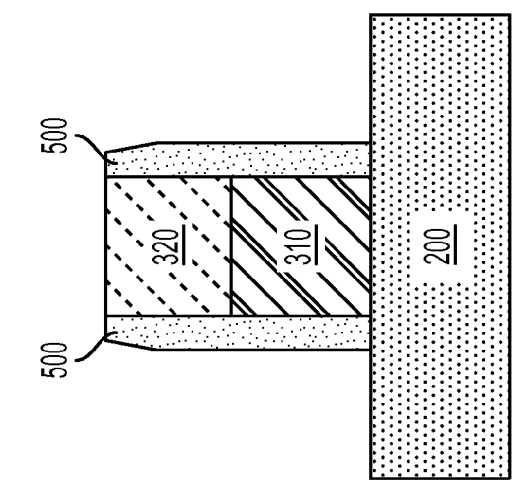
FIG. 3 illustrates a gate stack disposed on a substrate.

The following figures show an example of a formation of a gate stack to illustrate the exemplary methods described herein. It will be appreciated that many type of devices in which the exemplary methods can be implemented are contemplated in other exemplary embodiments. FIG. 2 illustrates a substrate 200 onto which a gate stack can be formed. In the example, the substrate is bulk silicon (Si). It can be appreciated that any suitable substrate can be implemented such as but not limited to a silicon-on-insulator (SOI) substrate. FIG. 3 illustrates a gate stack 300 disposed on the substrate 200. In exemplary embodiments, the gate stack 300 can be any suitable gate stack. For example, the exemplary transistors described can be high-κ metal-gate (HKMG) transistors in which high-κ dielectrics are used in conjunction with metals to form the gate stack 300. The term "high-κ dielectric" refers to a material with a high dielectric constant κ (for example, as compared to $SiO_2$) used in semiconductor manufacturing processes, which replaces the $SiO_2$ only gate dielectric. The gate stack 300 can therefore include an HK dielectric layer 310 deposited over the substrate 200. The HK dielectric layer 310 can be any suitable HK dielectric material such as, but not limited to, hafnium (Hf). The gate stack 300 can further include a metal layer 320 including, but not limited to, aluminum (Al). FIG. 4 illustrates a spacer material 400 deposited on the substrate 200 and gate stack 300. FIG. 5 illustrates a portion of the spacer material 400 removed, forming suitable isolating spacers 500. The spacers 500 are any suitable insulating material (e.g., silicon nitride (SiN) that provides isolation between the gate stack 300 and the subsequently defined source and drain regions, which are subsequently defined adjacent to the gate stack 300. As described further herein, in exemplary embodiments, a low dose LDD extension implant is performed adjacent the gate stack 300. Any suitable photolithography and masking methods are implemented to define the gate stack 300 and remove the spacers 500. In addition, any suitable etching techniques such as, but not limited to, wet chemical etching and RIE are implemented.

FIG. 6 illustrates an example of the device 100 if a conventional high extension dose is implemented to form source (S) and drain (D) regions. A typical high extension dose can range from 1E15 atoms/$cm^2$ to 5E15 atoms/$cm^2$. The energy of the implant depends on the extension species. For example, for a boron di-fluoride ($BF_2$) extension, the energy can be ~3-10 keV and for a B extension, the energy can be about 0.5 keV to 2 keV. Typically, a device, such as the device 100, has a fixed gate length, Lgate, that is determined by the geometry of the gate stack 300 and spacers 500. After the high extension dose, as indicated by arrows 600, the device then typically has an effective electrical gate length, Leff (also known as effective channel length), which depends on the extent to which the high extension dose causes junctions 610, 620 the source and drain regions to protrude towards the gate (i.e., gate stack 300, and spacers 500). As shown in FIG. 6, the junctions 610, 620 extend beneath the spacers and below the gate dielectric layer 310. Typically, the difference between Lgate and Leff is a constant, Lgate–Leff=constant based on the doping conditions and geometry of the device.

FIG. 7 illustrates an example of the device implementing the exemplary low extension dose, as described herein, to form source (S) and drain (D) regions. As described herein, a device, such as the device 100 has a fixed gate length, Lgate, which is determined by the geometry of the gate stack 300 and spacers 500. After the exemplary low extension dose, as indicated by arrows 700, the gate then still has an effective gate length, Leff, but the low extension dose causes junctions 710, 720 the source and drain regions to protrude less towards the gate (i.e., gate stack 300, and spacers 500). That is, the junctions 710 may only extend slight below the spacers 500 and not below the gate dielectric layer. As such, the difference between Lgate and Leff, Lgate–Leff=constant can be varied based on the doping conditions of the low extension dose. In exemplary embodiments, the low extension doses described herein can vary Lgate–Leff, with results as described herein, such as, but not limited to, the pull down PFET becoming more resistive, thus lowering the current drive without increasing the channel length or the Vt. The PFET is underlapped, lowering the leakage in the transistor inverters, as well as the total standby power in the 6T or 8T array.

FIG. 8 illustrates the device 100 with a comparison of the source and drain junctions of the high extension dose and the low extension dose, respectively overlapped. It is appreciated that FIG. 8 is only illustrative showing a comparison.

In exemplary embodiments, the doping conditions for the PFET as described herein are now discussed. For the source (i.e., S) and drain (i.e., D) regions, any suitable p-type dopant can be used, including, but not limited to boron (B), aluminum (Al), gallium (Ga), indium (In), and $BF_2$. In exemplary embodiments, the extension implant energy can be about 1-10 keV, and the extension dose can be about 1E10 atoms/$cm^2$ to 1E13 atoms/$cm^2$.

Figure 9:
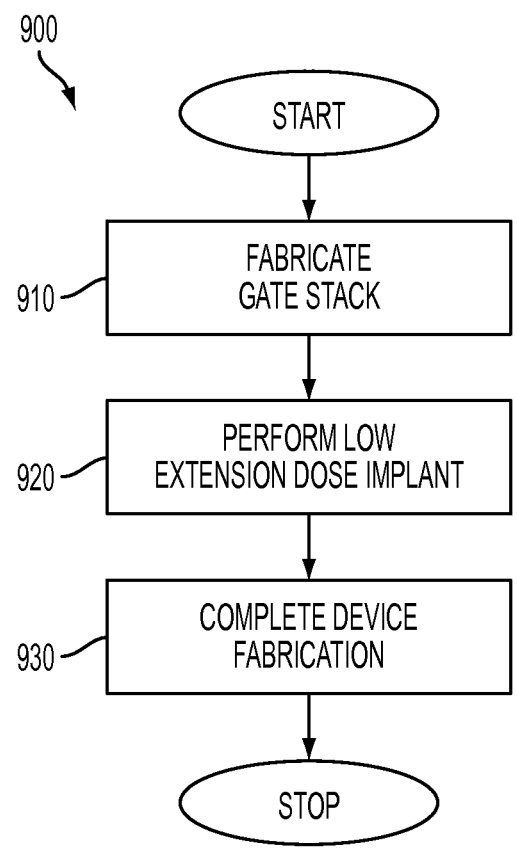
FIG. 9 illustrates a flowchart for a method of implanting a device with a low dose extension in accordance with exemplary embodiments.

FIG. 9 illustrates a flowchart for a method 900 of implanting the device with a low dose extension in accordance with exemplary embodiments. At block 910, the gate stack 300 is fabricated on the substrate 100 as described herein. At block 920, the low extension dose is performed as described herein to form the source and drain regions. At block 930, fabrication of the device 100 is complete, which may include any further CMOS steps including but not limited to further implants, and forming metal interconnects.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention, and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A static random access memory (SRAM) fabrication method, comprising:
    forming a first gate stack and a second gate stack on a substrate, the first gate stack and the second gate stack having a gate dielectric layer having a width;
    forming first isolating spacers adjacent to the first gate stack, the isolating spacers and first gate stack having a gate length, Lgate;
    forming second isolating spacers adjacent to the second gate stack such that a second source region and a second drain region underlap the second isolating spacers, wherein the second gate stack, the isolating spacers and second gate stack have the gate length Lgate;
    forming a first source region and first drain region adjacent the first gate stack, which generates an effective electrical gate length, Leff, wherein the first source region, the first drain region and the first gate stack define a pull down transistor;
    forming the second source and the second drain region adjacent the second gate stack, wherein the second source region, the second drain region and the second gate stack define a pull up transistor and wherein the second source and second drain regions are formed from a high extension dose implant performed at a dose between $1\times10^{15}$ atoms/cm$^2$ to $5\times10^{15}$ atoms/cm$^2$,
    wherein the first source and first drain regions are formed from a low extension dose implant performed at a dose between $1\times10^{10}$ atoms/cm$^2$ to $1\times10^{13}$ atoms/cm$^2$ that decreases a difference between Lgate and Leff, such that the first source and first drain regions underlap only the first isolating spacers, and that Leff is greater than the width of the gate dielectric layer, the low extension dose implant not affecting a transition voltage or a channel length of the SRAM, and
    wherein the pull down transistor has a higher resistance than the pull up transistor.

2. The method as claimed in claim 1 wherein the low extension dose implant is performed at an energy between 1 keV and 10 keV.

3. The method as claimed in claim 1 wherein the low extension dose implant is a p-type implant.

4. The method as claimed in claim 1 wherein the pull down transistor is a p-type field effect transistor (PFET) having a drive current, a channel length, and a transition voltage, Vt.

5. The method as claimed in claim 1 wherein the high dose extension implant is performed at an energy between 0.5 keV and 10 keV.

6. The method as claimed in claim 1 wherein the higher resistance lowers a drive current of pull down transistor, and maintains the channel length and the Vt.

7. A static random access memory (SRAM) fabrication method, comprising:
    performing a low extension dose implant adjacent a pull down transistor comprising a first gate stack and isolating spacers on a substrate, wherein the low dose extension implant is performed at an energy between 1 keV and 10 keV and at a p-type dose between $1\times10^{10}$ atoms/cm$^2$ to $1\times10^{13}$ atoms/cm$^2$, such that the low dose extension implant underlaps only the isolating spacers, the low extension dose implant not affecting a transition voltage, Vt, or a channel length of the SRAM; and
    performing a high extension dose implant adjacent a pull up transistor comprising a second gate stack and isolating spacers on the substrate, wherein the high dose extension implant is performed at an energy between 0.5 keV and 10 keV and at a p-type dose between $1\times10^{15}$ atoms/cm$^2$ to $5\times10^{15}$ atoms/cm$^2$, such that a second source region and a second drain region underlap the second isolating spacers and the second gate stack,
    wherein the pull down transistor has a higher resistance than the pull up transistor.

8. The method as claimed in claim 7 wherein the low extension dose implant forms source and drain regions that determine a difference between a gate length and an effective gate length of the first gate stack and isolating spacers.

9. The method as claimed in claim 8 wherein the pull down transistor is a p-type field effect transistor (PFET) having a drive current, a channel length and the transition voltage, Vt.

10. The method as claimed in claim 9 wherein the higher resistance lowers the drive current of the pull down transistor, and maintains the channel length and the Vt.

11. The method as claimed in claim 7 wherein the low extension dose implant underlaps the gate stack, and determines a difference between a gate length and an effective gate length of the gate stack and isolating spacers.

12. The method as claimed in claim 7 wherein the low extension dose implant is performed with a p-type material selected from the group consisting of: boron (B), aluminum (Al), gallium (Ga), indium (In), and boron fluoride (BF$_2$).

* * * * *